US006844839B2

(12) United States Patent
Lee et al.

(10) Patent No.: US 6,844,839 B2
(45) Date of Patent: Jan. 18, 2005

(54) REFERENCE VOLTAGE GENERATING CIRCUIT FOR LIQUID CRYSTAL DISPLAY

(75) Inventors: Hwa Jeong Lee, Kyoungki-do (KR); Yong Il Kim, Kyoungki-do (KR)

(73) Assignee: Boe-Hydis Technology Co., Ltd., Kyoungki-do (KR)

( * ) Notice: Subject to any disclaimer, the term of this patent is extended or adjusted under 35 U.S.C. 154(b) by 0 days.

(21) Appl. No.: 10/745,863

(22) Filed: Dec. 24, 2003

(65) Prior Publication Data

US 2004/0183707 A1 Sep. 23, 2004

(30) Foreign Application Priority Data

Mar. 18, 2003 (KR) ................................ 10-2003-0016710

(51) Int. Cl.[7] ............................ H03M 1/66; G09G 3/36
(52) U.S. Cl. ......................................... 341/144; 345/89
(58) Field of Search ................................ 341/108, 110, 341/143, 144, 154; 345/87, 89, 99, 212, 690

(56) References Cited

U.S. PATENT DOCUMENTS 6,515,676 B1 * 2/2003 Kasai et al. ................ 345/629
2002/0180680 A1 * 12/2002 Moon .......................... 345/89
2003/0058235 A1 * 3/2003 Moon ......................... 345/212
2003/0151578 A1 * 8/2003 Morita ........................ 345/89
2003/0151617 A1 * 8/2003 Morita ....................... 345/690
2003/0201959 A1 * 10/2003 Sakaguchi ................... 345/87
2004/0104831 A1 * 6/2004 May et al. .................. 341/144
2004/0104874 A1 * 6/2004 Monomohshi ............... 345/87
2004/0169627 A1 * 9/2004 Hong .......................... 345/89

* cited by examiner

*Primary Examiner*—Michael Tokar
*Assistant Examiner*—Linh Van Nguyen
(74) *Attorney, Agent, or Firm*—Ladas & Parry LLP

(57) ABSTRACT

Disclosed is a reference voltage generating circuit for a liquid crystal display liquid crystal display. The reference voltage generating circuit comprising: an analog voltage generating means for pre-storing a synchronizing signal and digital data signals inputted from outside in response to a write-enable signal, and converting the stored digital data signals into multiple sets of analog voltage signal pairs in response to an output-enable signal; a plurality of variable reference voltage generating means for voltage-distributing corresponding analog voltage signal pairs from among the analog voltage signal pairs generated by the analog voltage generating means, and outputting a plurality of variable reference voltage signals, respectively; a plurality of fixed reference voltage generating means for voltage-distributing a boosted source voltage, so as to output a plurality of fixed reference voltage signals respectively; and a source-driver integrated circuit for receiving the variable reference voltage signals and the fixed reference voltage signals.

5 Claims, 3 Drawing Sheets

REFERENCE VOLTAGE GENERATING CIRCUIT FOR LIQUID CRYSTAL DISPLAY

BACKGROUND OF THE INVENTION

1. Field of the Invention

The present invention relates to a reference voltage generating circuit for a liquid crystal display, and more particularly to a reference voltage generating circuit which generates reference voltages for video signals to be provided to a liquid crystal panel.

2. Description of the Prior Art

The conventional liquid crystal display comprises a liquid crystal panel section, a gate driver section, a source driver section, a timing control section, and a fixed reference voltage generating section. Particularly, a liquid crystal display having a liquid crystal panel section, a gate driver section, and a source driver section mounted on the same substrate is called 'chip-on-glass type liquid crystal display'.

In a liquid crystal panel, pixels, each of which has RGB liquid crystal, are arranged in a matrix pattern, gate lines for driving the pixels are arranged in the row direction and are connected respectively to the gates of transistors in the pixels, and data lines for applying video signals to the pixels are arranged in the column direction and are connected respectively to the sources of transistors in the pixels.

The gate driver section outputs gate signals through the gate lines for each field in response to a gate line control signal.

The source driver section receives signals gamma-corrected on the basis of voltage-transmittance (V-T) characteristics from the timing control section in response to signals of data lines according to the gate signals of the gate driver section, and applies fixed reference voltages selected by RGB data to respective liquid crystal cells.

The timing control section applies RGB data provided from outside to the source driver section, and simultaneously generates a horizontal scanning pulse, a vertical scanning pulse, a polarity reversal pulse POL, a clock pulse CLK, a chip select pulse CS, a shift clock SCLK, a latch signal LT, serial data RSCL and RSDA on the basis of a horizontal synchronizing signal and a vertical synchronizing signal provided from outside, thereby providing the generated signals to the source driver section.

The fixed reference voltage generating means comprises a fixed reference voltage distribution section, a buffer amplification section, and a multiplexer section. The fixed reference voltage generating means outputs reference voltages, which are required when signals having voltages corresponding to RGB digital data are outputted to respective signal lines from data signals of the source driver section, to a source-driver integrated circuit (IC) through the fixed reference voltage distribution section.

FIG. 1 is a circuit diagram for explaining a conventional fixed reference voltage generating means 100.

As shown in FIG. 1, a fixed reference voltage generating means 100 comprises a voltage division circuit 110 including a plurality of resistors R0 to Rn, which are connected in series to each other and located sequentially between two of nodes including reference voltage nodes V1 to Vn and a ground node. The fixed reference voltage generating means 100 receives a source voltage AVDD, and transmits divided voltages V1 to Vn to a multiplexer section (not shown) through a buffer amplification section 120.

The buffer amplification section 120 amplifies the voltages V1 to Vn provided through the resistors R0 to Rn, and transmits the amplified voltages to the multiplexer section. That is, the fixed reference voltage generating means is used to provide instructions indicating a voltage which should be selected from among the reference voltages Vref1 to Vrefn in the source drive IC. Herein, the respective resistors R0 to Rn have the same resistance value with each other. Also, the buffer amplification section 120 uniformly amplifies the reference voltages Vref1 to Vrefn for gamma correction and provides the amplified reference voltages to the multiplexer section.

FIG. 2 is an internal block diagram of a source driver IC for explaining a process in which the reference voltage Vref1 to Vrefn generated in the fixed reference voltage generating means 100 are transmitted to each of data lines.

As shown in FIG. 2, respective reference voltages Vref1 to Vrefn are transmitted to a multiplexer section 200 included in a source driver IC. The multiplexer section 200 classifies the reference voltages Vref1 to Vrefn into changed sets (m1, m2, . . . ) of red reference voltages, green reference voltages, and blue reference voltages, on the basis of polarity reversal pulses, which are alternating currents and used to drive a liquid crystal panel, and transmits the classified reference voltages to a digital-analog conversion section 210. When RGB digital data D0 to Dn supplied from a timing control section (not shown) are level-shifted and transmitted to the digital-analog conversion section 210, the digital-analog conversion section 210 gamma-corrects the digital data D0 to Dn on the basis of the reference voltages Vref1 to Vrefn transmitted from the multiplexer section 200, and applies output signals O1 to On to data lines through a buffer amplification section 220, and so that the output signals O1 to On are transmitted to respective liquid crystals.

For example, in a case in which RGB digital data supplied from outside are 8-bit data (R0~R7, G0~G7, B0~B7), the multiplexer section 200 receives 256 reference voltages for each of RGB signals from the fixed reference voltage generating means 100, selects one of 256 reference voltages Vref1 to Vrefn (V1~V256) on the basis of the RGB digital data D0 to D7, gamma-corrects the RGB digital data D0 to D7 according to one of red reference voltages, green reference voltages, and blue reference voltages, and transmits the gamma-corrected data to the digital-analog conversion section 210. The digital-analog conversion section 210 converts corrected reference voltages into analog blue signals $V_{Bn}$, analog green signals $V_{Gn}$ and analog red signals $V_{Rn}$, and transmits the converted signals to a buffer amplification section 220, and then output signals O1 to On corresponding to a liquid crystal panel are applied to each data line.

Hereinafter, a method for determining the reference voltage values Vref1 to Vrefn will be described as follows with reference to FIG. 3.

FIG. 3 is a graph showing the correspondence relationships between voltage and transmittance. In general, according to screen display principle of a liquid crystal display, when voltages corresponding to respective video information are applied to liquid crystal interposed between pixel electrodes, difference of the applied voltage values causes difference of molecular orientation of liquid crystal, so as to cause difference of transmittance of light, thereby changing color level. At this time, reference voltages VA to VD, which have fixed voltage values determined by the fixed reference voltage generating means, are used.

As shown in FIG. 3, reference voltages VA to VD in the horizontal direction show a particular curve in which transmittance (T) is changed proportionally between a maximum voltage and a minimum voltage. The particular curve has been obtained from measured magnitudes of transmitted light in which voltages are applied at regular intervals with minimum and maximum values of positive voltages as VA and VB and minimum and maximum values of negative voltages as VC and VD.

The graph shown in FIG. 3 has a symmetric structure on the basis of voltages VB and VC. In FIG. 3, a reference mark 'T' represents the magnitude of light transmitting liquid crystal. Also, reference marks VA to VD represents reference voltages applied to pixel electrodes of the liquid crystal, and one graph corresponding voltages VA to VB represents transmittances of the case of applying positive voltages and the other graph corresponding to voltages VC to VD represents transmittances of the case of applying negative voltages. Herein, the values of the determined voltages VA to VD are values corresponding to the reference voltages Vref1 to Vrefn generated by the fixed reference voltage generating means, and it is very difficult to change reference voltage values after being determined.

However, liquid crystal displays have difference little by little in the slope of the voltage-transmittance graph according to manufacturing companies, so that it is required to set variable reference voltage values VA', VB', VC', and VD' in order to obtain the slope of a desired curve after maximum and minimum voltage values are determined.

SUMMARY OF THE INVENTION

Accordingly, the present invention has been made to solve the above-mentioned problems occurring in the prior art, and an object of the present invention is to provide a liquid crystal display, which has a variable reference voltage generating section which enables a user to obtain desired color levels, by determining variable reference voltage values by software in addition to the fixed reference voltages.

In order to accomplish this object, there is provided a reference voltage generating circuit for a liquid crystal display, the reference voltage generating circuit comprising: an analog voltage generating means for pre-storing a synchronizing signal and digital data signals inputted from outside in response to a write-enable signal, and converting the stored digital data signals into multiple sets of analog voltage signal pairs in response to an output-enable signal; a plurality of variable reference voltage generating means for voltage-distributing corresponding analog voltage signal pairs from among the analog voltage signal pairs generated by the analog voltage generating means, and outputting a plurality of variable reference voltage signals, respectively; a plurality of fixed reference voltage generating means for voltage-distributing a boosted source voltage, so as to output a plurality of fixed reference voltage signals respectively; and a source-driver integrated circuit for receiving the variable reference voltage signals and the fixed reference voltage signals.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
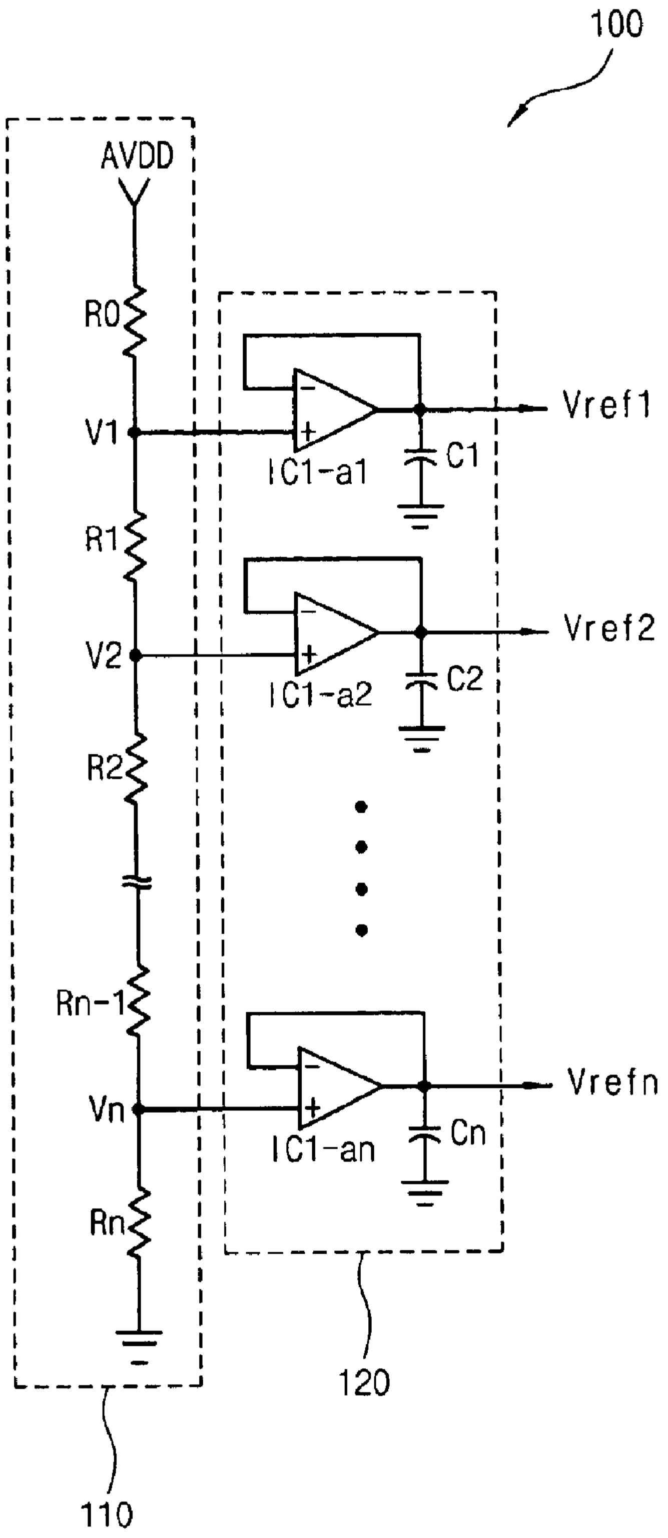
FIG. 1 is a circuit diagram for explaining a conventional fixed reference voltage generation process.
Figure 2:
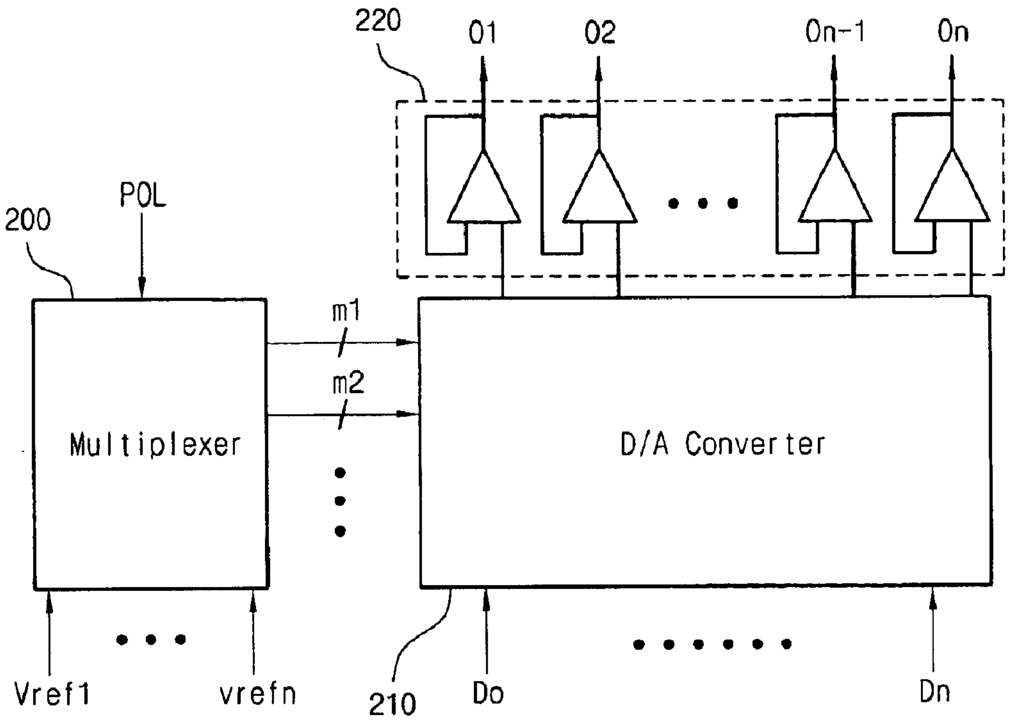
FIG. 2 is a block diagram for explaining a process in which the conventional fixed reference voltages are transmitted to a liquid crystal panel as data signals.
Figure 3:
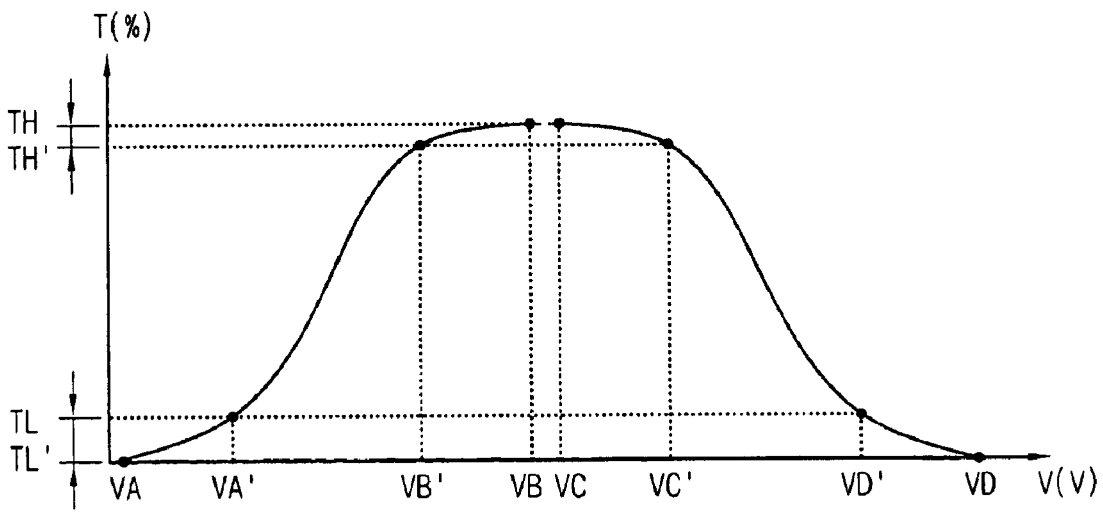
FIG. 3 is a graph for explaining voltage-transmittance characteristics of liquid crystal.
Figure 4:
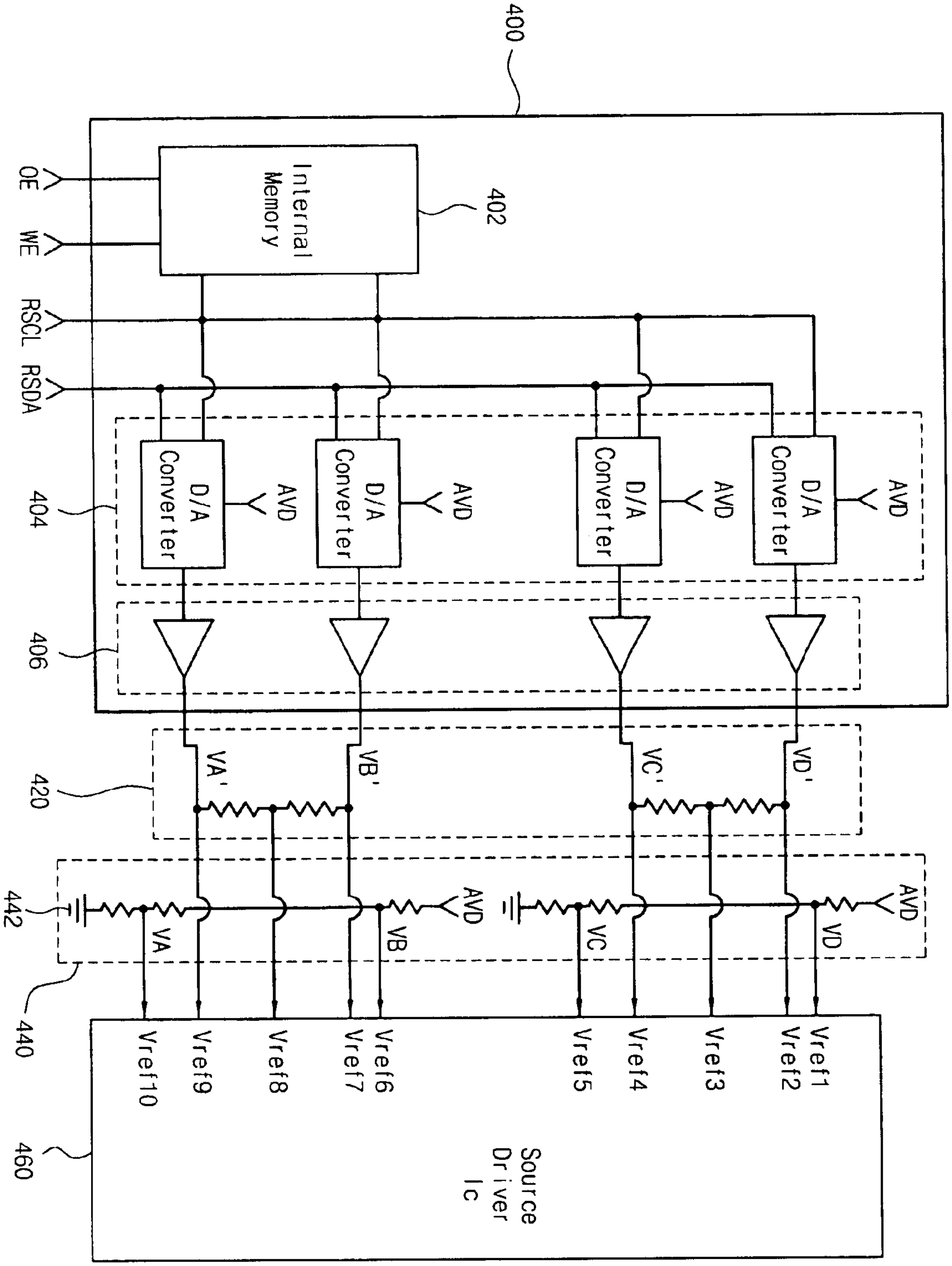
FIG. 4 is a circuit diagram for explaining a process of generating a reference voltage generation process according to the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted. FIG. 4 is a circuit diagram for explaining a reference voltage generating circuit according to the present invention.

As shown in FIG. 4, a reference voltage generating circuit according to the present invention comprises an analog voltage generating means 400, a variable reference voltage generating means 420, a fixed reference voltage generating means 440, and a source driver section 460.

The analog voltage generating means 400 includes a data store section 402, a digital-analog conversion section 404, and a buffer amplification section 406. The analog voltage generating means 400 stores an inputted synchronizing signal RSCL and an inputted digital data signal RSDA in the data store section 402 in response to a write-enable signal applied from outside, and transmits the digital data signal RSDA stored in the data store section 402 to the digital-analog conversion section 404 in response to an output-enable signal OE. In this case, when an output-enable signal OE is generated, the digital-analog conversion section 404 converts a digital data signal RSDA into an analog voltage in response to the synchronizing signal RSCL of the data store section 402, and transmits the converted analog voltage to the buffer amplification section 406.

The analog signal transmitted to the buffer amplification section is amplified by the buffer amplification section, is transmitted to variable reference voltage generating means, and is then outputted as a plurality of analog voltage signals VA', VB', VC' and VD'.

Herein, the digital data signal RSDA, which is a signal providing information of variable reference voltages to the digital-analog conversion section 404, employs an RSCL signal as the synchronizing signal, and the digital data signal RSDA itself is used as an address and data signal. Through these signals, the variable reference voltages VA', VB', VC', and VD' are calculated. For example, a digital data signal of random access discrete address (RADA) includes a start signal, an address signal, a data signal, and an end signal. Herein, each of the start signal and the end signal can be realized by 1 bit, respectively. The address signal has bits, the number of which changes according to the number of buffers. Therefore, when the number of the buffers is four, the address signal requires at least 2 bits. The number of bits for a data signal to a data line changes according to resolution, and the resolution can be determined according to the purpose of a user. For example, in a case in which a source voltage AVDD is 10V, if the data signal consists of 6 bits, a dividable voltage become "AVDD×1/64", so that variable reference voltage values can be controlled with increase or decrease by 0.156V. In this example, if the data signal consists of 8 bits, a dividable voltage become "AVDD×1/256", so that variable reference voltage values can be increased or decreased by 0.040V.

When desired variable reference voltages VA', VB', VC', and VD' are calculated using the digital data signal RSDA, the values of the digital data are recorded in a data store section 402 included in the analog voltage generating means 400.

A signal process in the data store section 402 is performed through external signal terminals, and then external control signals for controlling the signals are performed by using a left button, a right button, and a select button of an On Screen Display (OSD), or the signal process is performed by controlling the values of resistors in the analog voltage generating means 400.

The variable reference voltages VA', VB', VC', and VD', which are determined by above-mentioned method, are divided according to resistors in the variable reference voltage generating means 420, and are transmitted to the source driver section 460.

The fixed reference voltage generating means 440 has voltage division circuits including a plurality of resistors and being connected in series among a ground node 442 and nodes VA, VB, VC, and VD of reference voltages, receives a source voltage AVDD to divide reference voltages, amplifies the divided reference voltages, and transmits the amplified reference voltages to the source driver section 460.

As described above, a liquid crystal display according to the present invention generates variable reference voltages by a digital-analog conversion section and a data store section in an analog voltage generating means, so that the liquid crystal display according to the present invention has a reference voltage control function by software in addition to the control functions by hardware, which the conventional fixed reference voltage generating means has, thereby enabling reference voltages to be easily corrected.

Also, the present invention has an advantage in that reference voltages can be easily corrected according to necessity even though after the values of fixed reference voltages are determined. In addition, the correction of reference voltages is performed by software, not by hardware, so that disassembly/assembly processes of a liquid crystal display are not necessary, and thereby a process correcting reference voltages is greatly simplified.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A reference voltage generating circuit for a liquid crystal display, the reference voltage generating circuit comprising:

an analog voltage generating means for pre-storing a synchronizing signal and digital data signals inputted from outside in response to a write-enable signal, and converting the stored digital data signals into multiple sets of analog voltage signal pairs in response to an output-enable signal;

a plurality of variable reference voltage generating means for voltage-distributing corresponding analog voltage signal pairs from among the analog voltage signal pairs generated by the analog voltage generating means, and outputting a plurality of variable reference voltage signals, respectively;

a plurality of fixed reference voltage generating means for voltage-distributing a boosted source voltage, so as to output a plurality of fixed reference voltage signals respectively; and a source-driver integrated circuit for receiving the variable reference voltage signals and the fixed reference voltage signals.

2. A reference voltage generating circuit as claimed in claim 1, wherein the analog voltage generating means comprises:

a data store section for storing the synchronizing signal and the digital data signals inputted from outside in response to the write-enable signal;

a digital-analog conversion section for converting the digital data signals into respective analog signals in response to a synchronizing signal of the data store section when the output-enable signal is generated; and a buffer amplification section for amplifying the analog signals converted by the digital-analog conversion section, and outputting the multiple sets of analog voltage signal pairs.

3. A reference voltage generating circuit as claimed in claim 1, wherein the variable reference voltage generating means has a plurality of resistors corresponding to analog voltage signal pairs, the resistors being connected in series.

4. A reference voltage generating circuit as claimed in claim 1, wherein the fixed reference voltage generating means generates fixed reference voltages by a plurality of resistors connected among nodes of analog reference voltages and a ground node.

5. A reference voltage generating circuit as claimed in claim 1, wherein the analog voltage signal pairs have gray voltage values corresponding to voltages between the maximum value and the minimum value of a voltage-transmittance characteristic curve.

* * * * *